United States Patent
Mulligan et al.

(10) Patent No.: US 7,520,753 B1
(45) Date of Patent: Apr. 21, 2009

(54) METHOD OF USING COIL CONTACT AS ELECTRICAL INTERCONNECT

(75) Inventors: Vincent P. Mulligan, Wappingers Falls, NY (US); Robert F. Florence, Jr., Poughkeepsie, NY (US); Michael J. Domitrovits, New Paltz, NY (US); Tak O. Leung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/058,792

(22) Filed: Mar. 31, 2008

(51) Int. Cl.
*H01R 12/00* (2006.01)
(52) U.S. Cl. .............. 439/66; 439/91; 439/591
(58) Field of Classification Search ........... 439/65, 439/66, 71, 74, 75, 86, 90, 91, 591
See application file for complete search history.

(56) References Cited

U.S. PATENT DOCUMENTS

| | | | |
|---|---|---|---|
| 4,418,252 A * | 11/1983 | Daigle ................ | 200/16 A |
| 5,388,998 A * | 2/1995 | Grange et al. .......... | 439/66 |
| 5,611,696 A | 3/1997 | Donner et al. | |
| 6,043,666 A * | 3/2000 | Kazama ............... | 324/754 |
| 6,846,184 B2 * | 1/2005 | Fan et al. ............ | 439/66 |
| 6,909,056 B2 | 6/2005 | Vinther | |
| 2002/0019153 A1 * | 2/2002 | Audet et al. .......... | 439/66 |
| 2003/0016037 A1 * | 1/2003 | Kazama ............... | 324/754 |
| 2003/0176113 A1 * | 9/2003 | Sasaki ................ | 439/700 |
| 2004/0257099 A1 * | 12/2004 | Kazama ............... | 324/754 |
| 2007/0134948 A1 | 6/2007 | Brodsky et al. | |

\* cited by examiner

*Primary Examiner*—James Harvey
(74) *Attorney, Agent, or Firm*—Cahn & Samuels, LLP

(57) ABSTRACT

A method of using a coil contact as an electrical interconnect includes inserting at least one coil contact into a dielectric plate or housing. The at least one coil contact includes a beryllium copper coil plated with gold and having a tapered shape such that each end has a diameter smaller than the diameter of a middle section. The housing comprises an upper half comprising a surface that slopes outwardly from a center of the housing towards a top opening, and a lower half comprising a surface that slopes outwardly from the center of the housing to a bottom opening. The sloping surfaces of the upper half and the lower half form a concave shape that captivates the middle section of the coil contact. Each end of the at least one coil contact extends to account for variations in surfaces of the processor and the circuit board.

1 Claim, 3 Drawing Sheets

METHOD OF USING COIL CONTACT AS ELECTRICAL INTERCONNECT

I. FIELD OF THE INVENTION

This invention relates to a coil contact and a method of using the coil contact as an electrical interconnect between a computer system processor and a circuit board.

II. BACKGROUND OF THE INVENTION

Currently, semiconductors are mounted to a multi-chip module (MCM) package to form a system processor. The system processor is electrically connected to a system circuit board via an interconnect.

Known interconnects, such as the Cinch Fuzz Button, do not have adequate compliance for variations in the surfaces requiring electrical contact; must be affixed to a housing; do not have a design allowing for ease of manufacturing and scalability; and are not useful in repetitive testing cycles.

III. SUMMARY OF THE INVENTION

This invention provides a method of using a coil contact as an electrical interconnect. At least one coil contact is inserted into a dielectric plate or housing. The at least one coil contact comprises a beryllium copper coil plated with gold and has a tapered shape such that each end has a diameter smaller than the diameter of a middle section. The housing comprises an upper half and a lower half that forms a tapered shape for receiving or captivating the coil contact. The plate or housing is inserted between a computer system processor and a circuit board, thereby electrically connecting the processor and the circuit board via the at least one coil contact.

In the detailed description, references to "one embodiment", "an embodiment", or "in embodiments" mean that the feature being referred to is included in at least one embodiment of the invention. Moreover, separate references to "one embodiment", "an embodiment", or "in embodiments" do not necessarily refer to the same embodiment; however, neither are such embodiments mutually exclusive, unless so stated, and except as will be readily apparent to those skilled in the art. Thus, the invention can include any variety of combinations and/or integrations of the embodiments described herein.

Given the following enabling description of the drawings, the product and method should become evident to a person of ordinary skill in the art.

IV. BRIEF DESCRIPTION OF THE DRAWINGS

V. DETAILED DESCRIPTION OF THE DRAWINGS

FIGS. 1-6 shows a coil contact and method using the coil contact as an electrical interconnect between a computer system processor and a circuit board according to the present invention.

The coil contact of the present invention has compliance or play, thereby allowing it to adjust to variations in the surfaces requiring electrical contact and ensuring an electrical path between two parts. The coil contact does not need to be mechanically affixed to any housing. In addition, the coil contact design allows for ease of manufacturing and scalability. The coil contact has excellent electrical characteristics in both DC and AC testing, which require repetitive cycles.

The coil contact reduces the amount of shorts and open problems associated with known interconnects, such as the Cinch interconnect. The size and mass of the pins will handle the current while keeping crosstalk to a minimum. An example is the tapered cylindrical configuration with no need to overlap the contacts as in other connector designs. This will be important in future products as speeds of processors continue to increase above 2 GHz.

Figure 1:
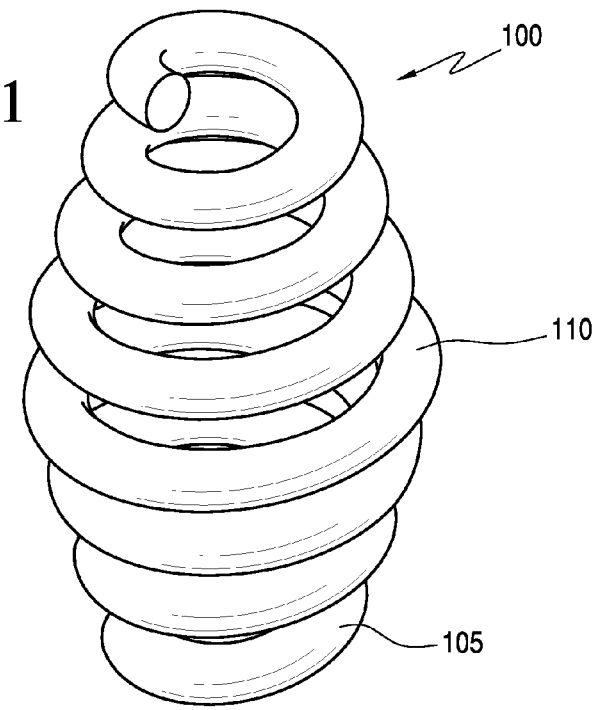
FIG. 1 illustrates a coil contact according to an embodiment of the present invention.

FIG. 1 illustrates a coil contact 100 according to an embodiment of the present invention. The coil contact 100 comprises a beryllium copper (BeCu) wire plated with gold. The wire is wound in windings such that it creates a coil shape. In embodiments, the coil may have a diameter of about 0.5 to about 0.8 mm. The coil contact has a tapered shape, with each end 105 having a smaller diameter than the diameter of a middle section 110. In embodiments, the coil contact may comprise an additional, separate flexible wire extending along the coil's internal longitudinal axis. The wire may limit electrical inductance and moves with the contact when the coil is compressed.

Figure 2:
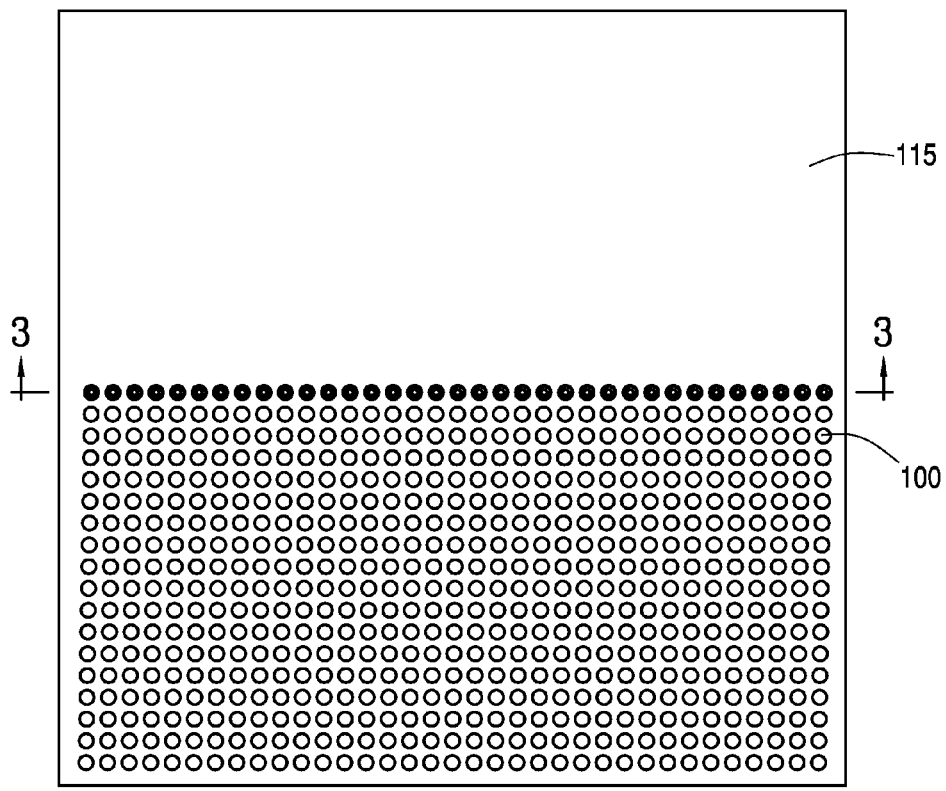
FIG. 2 illustrates an array of coil contacts in a plate or housing according to an embodiment of the present invention.

FIG. 2 is a top view of a plate or housing 115 holding a plurality of coil contacts 100 in an array configuration (rows and columns). The plate or housing may be a dielectric housing.

Figure 3:
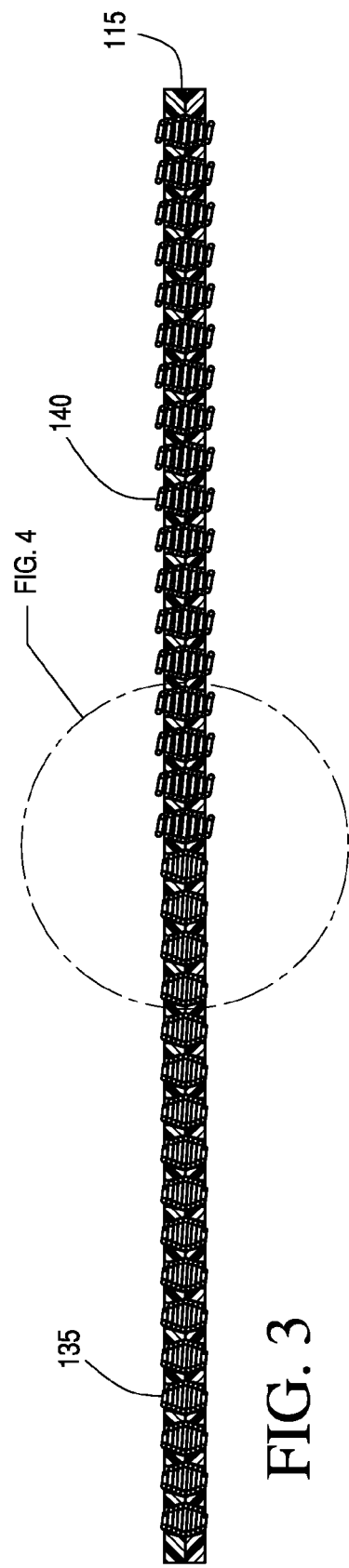
FIG. 3 is a side view of FIG. 2 along an A-A axis.
Figure 4:
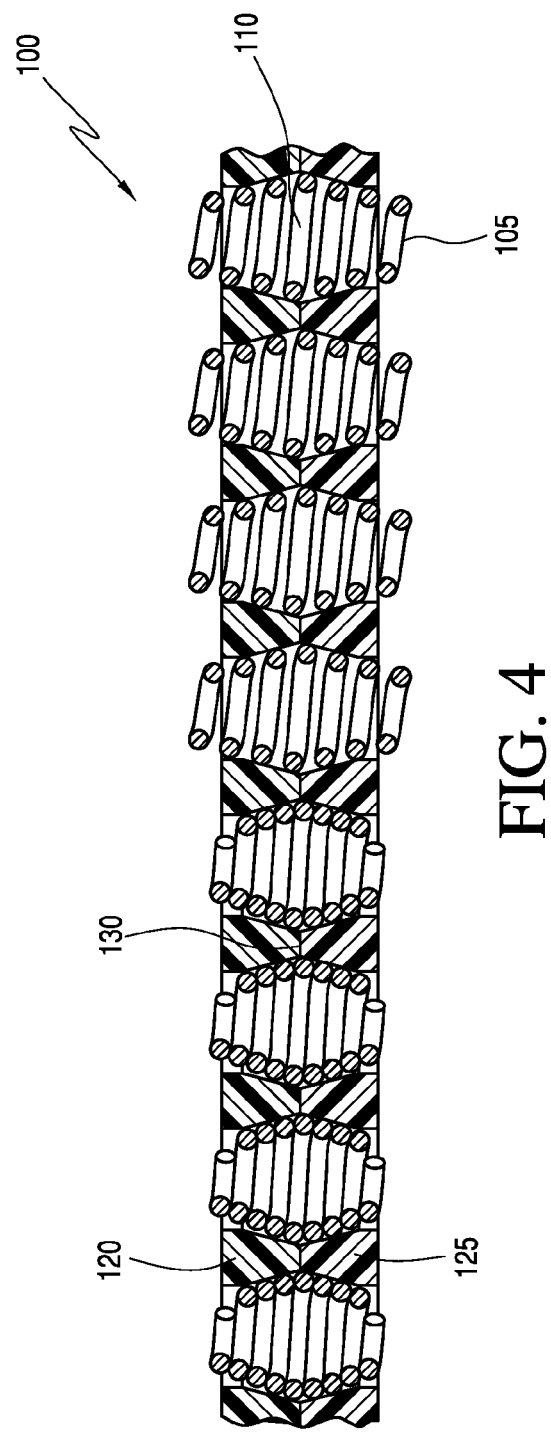
FIG. 4 is a detail B side view of FIG. 3.

As illustrated in FIGS. 3-4, the tapered shape of the coil contact 100 allows it to be easily placed within the plate or housing 115 without popping out and without requiring additional mechanical means (e.g., screws) or adhesive to affix the coil contacts within the plate. According to the present invention, the plate or housing 115 is formed in two halves, upper half 120 and lower half 125. The two halves form a tapered (e.g., sloped or concave) shape 130 that receives or captivates a tapered coil contact, with the ends of the coil contact near the top and bottom openings of the plate and the middle portion 110 of the coil contact in the concave shape where the two halves meet.

The tapered shape of the coil contact allows for larger contact areas for conducting current (when compressed). As shown in FIGS. 3-4, the coil contact may be compressed 135 or may be extended 140 to account for variations or differences in the surfaces that are to be electrically connected. In embodiments, the coil contact may have a cap on each end.

Figure 5:
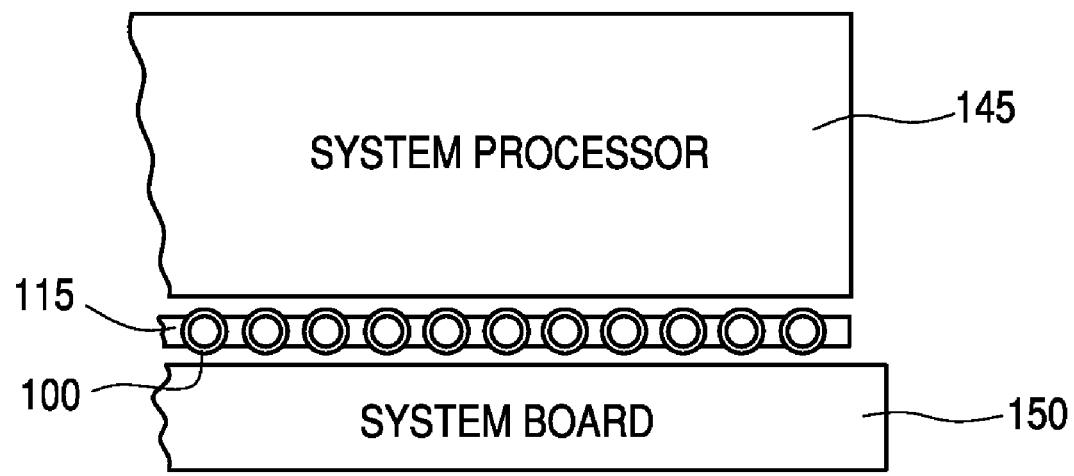
FIG. 5 is a schematic view of a system processor, interconnect, and system circuit board.
Figure 6:
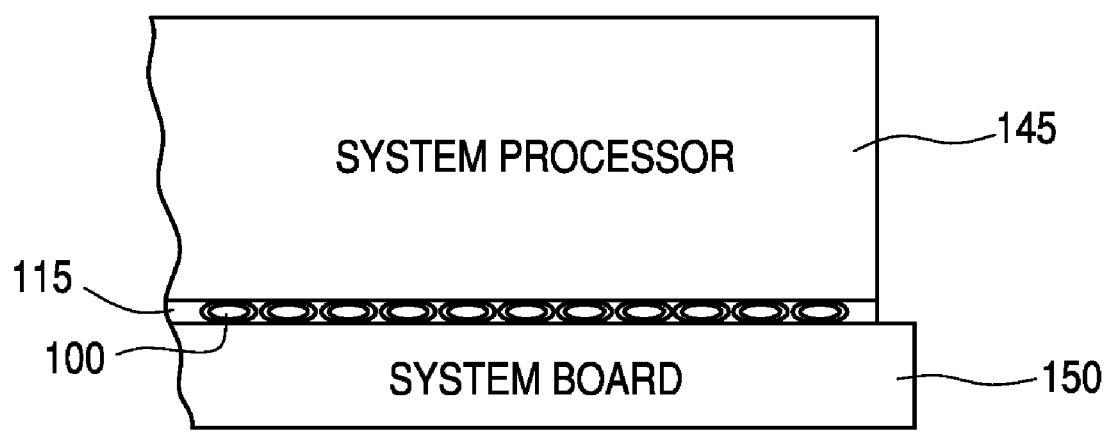
FIG. 6 is a schematic view of the interconnect electrically connecting the system processor and system circuit board of FIG. 5.

According to the present invention, the coil contacts may be individually changed by winding the coil and inserting a coil into the plate or housing. When the coil contact relaxes, it is retained in the plate or housing as described above. As illustrated in FIGS. 5-6, a plate 115 comprising an array of coil contacts 100 may be aligned so as to electrically connect a bottom side of an MCM 145 (system processor) and a pad of a system circuit board 150.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

The exemplary and alternative embodiments described above may be combined in a variety of ways with each other. Furthermore, the steps and number of the various steps illustrated in the figures may be adjusted from that shown.

Although the present invention has been described in terms of particular exemplary and alternative embodiments, it is not limited to those embodiments. Alternative embodiments, examples, and modifications which would still be encompassed by the invention may be made by those skilled in the art, particularly in light of the foregoing teachings.

The invention claimed is:

1. A method of using a coil contact as an electrical interconnect, comprising:

inserting at least one coil contact into a dielectric housing, said at least one coil contact comprising a beryllium copper coil plated with gold and having a tapered shape such that each end has a diameter smaller than the diameter of a middle section, said housing comprising an upper half and a lower half, wherein the upper half comprises a surface that slopes outwardly from a center of the housing towards a top opening in the housing and the lower half comprises a surface that slopes outwardly from the center of the housing to a bottom opening in the housing, wherein the sloping surface of the upper half and the sloping surface of the lower half form a concave shape that captivates the middle section of the coil contact;

inserting the housing between a computer system processor and a circuit board; and each end of the at least one coil contact extending to account for variations in surfaces of the processor and the circuit board and electrically connecting the processor and the circuit board via the at least one coil contact.

* * * * *